(12) United States Patent
Bruennert et al.

(10) Patent No.: US 7,771,206 B2
(45) Date of Patent: Aug. 10, 2010

(54) HORIZONTAL DUAL IN-LINE MEMORY MODULES

(75) Inventors: Michael Bruennert, München (DE); Peter Gregorius, München (DE); Georg Braun, Holzkirchen (DE); Andreas Gärtner, München (DE); Hermann Ruckerbauer, Moos (DE); George William Alexander, Durham, NC (US); Johannes Stecker, München (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 12/209,019

(22) Filed: Sep. 11, 2008

(65) Prior Publication Data

US 2010/0062621 A1    Mar. 11, 2010

(51) Int. Cl.
*H01R 12/00* (2006.01)
(52) U.S. Cl. ........................................................ 439/61
(58) Field of Classification Search .................... 439/61, 439/65, 68; 361/692, 752, 789, 784, 760; 438/612; 29/830
See application file for complete search history.

(56) References Cited

U.S. PATENT DOCUMENTS

| | | | | |
|---|---|---|---|---|
| 5,321,585 | A * | 6/1994 | Trittschuh et al. | 361/784 |
| 5,581,877 | A * | 12/1996 | Woychik et al. | 29/852 |
| 5,742,484 | A * | 4/1998 | Gillette et al. | 361/789 |
| 6,202,110 | B1 * | 3/2001 | Coteus et al. | 710/301 |
| 6,553,555 | B1 * | 4/2003 | Green et al. | 716/15 |
| 6,666,717 | B1 | 12/2003 | Choy | |
| 6,814,582 | B2 * | 11/2004 | Vadasz et al. | 439/61 |
| 7,156,701 | B1 | 1/2007 | Pennypacker et al. | |
| 7,172,465 | B2 | 2/2007 | Kinsley | |
| 2002/0071259 | A1 * | 6/2002 | Roos | 361/784 |
| 2007/0019390 | A1 | 1/2007 | Peterson | |
| 2008/0250292 | A1 * | 10/2008 | Djordjevic | 714/746 |

* cited by examiner

*Primary Examiner*—Alexander Gilman
(74) *Attorney, Agent, or Firm*—Slater & Matsil, L.L.P.

(57) ABSTRACT

Horizontal dual in-line memory modules are disclosed. In one embodiment, the memory module includes a circuit board, a plurality of memory chips attached to a top surface of the circuit board, and a plurality of connector contacts disposed under a back surface of the circuit board and extending away from the memory chips, the connector contacts being electrically coupled to the memory chips, the back surface opposite the top surface of the circuit board.

34 Claims, 14 Drawing Sheets

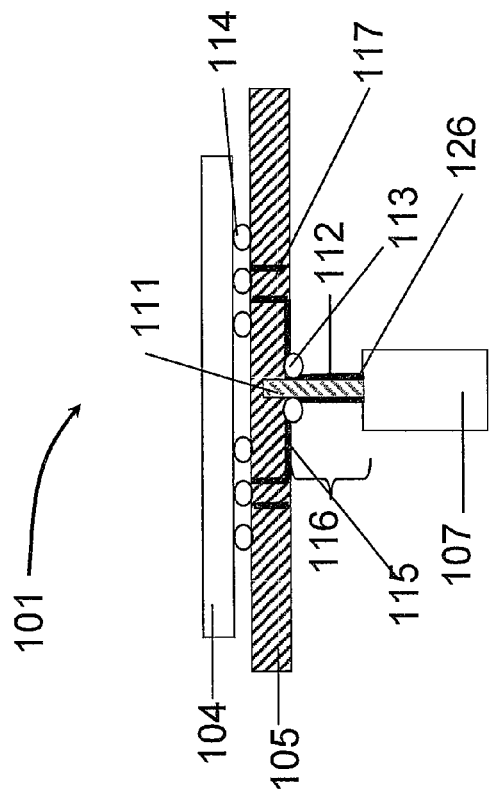
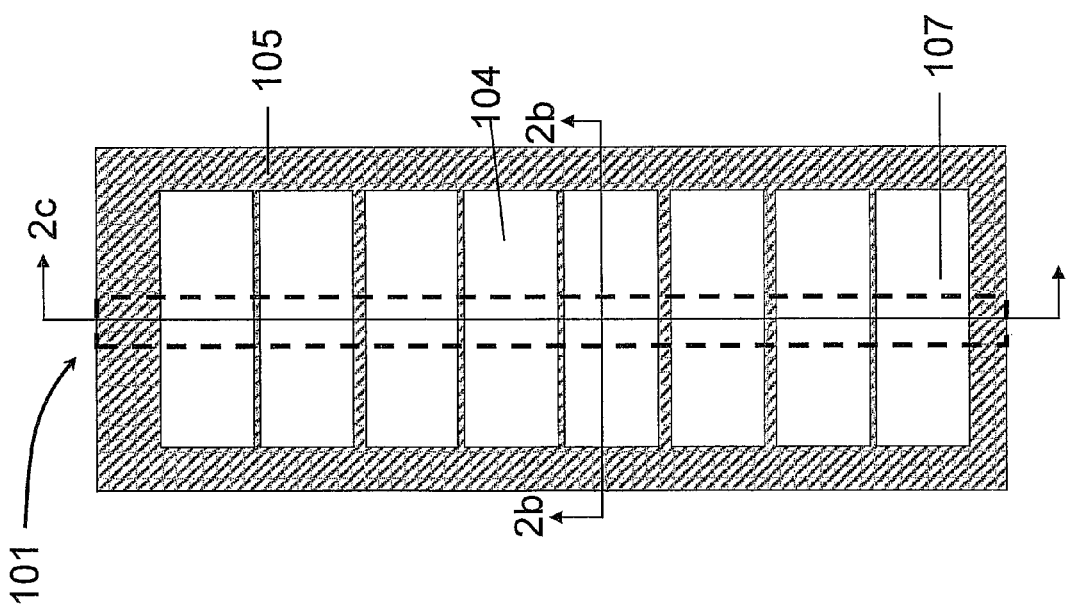

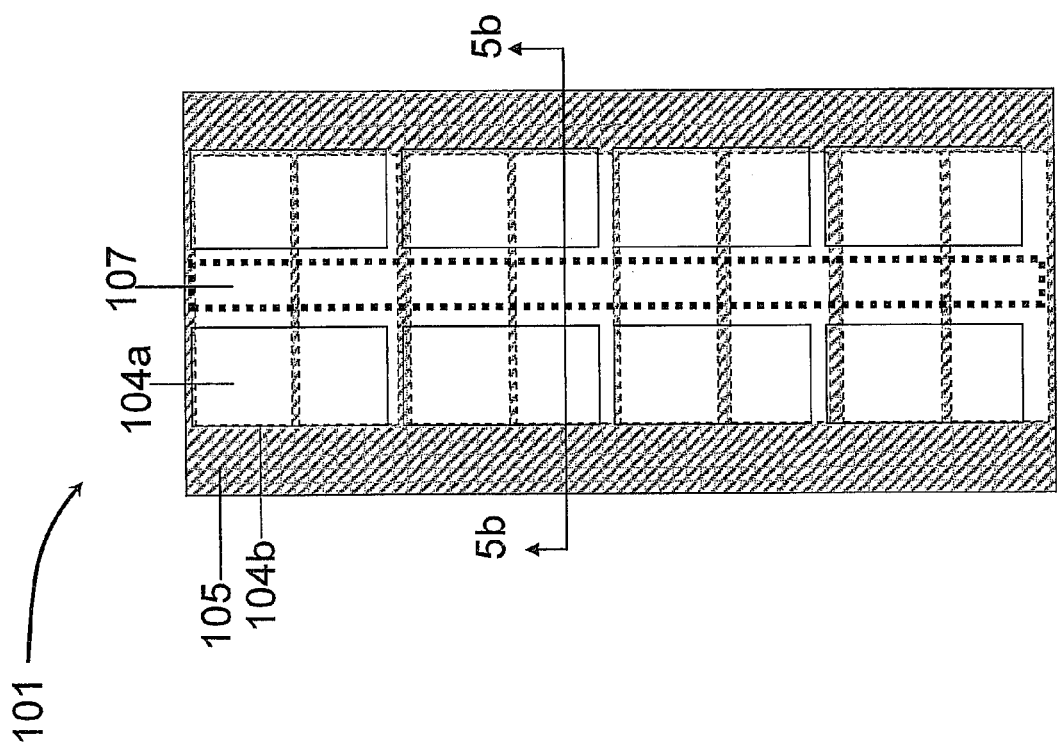

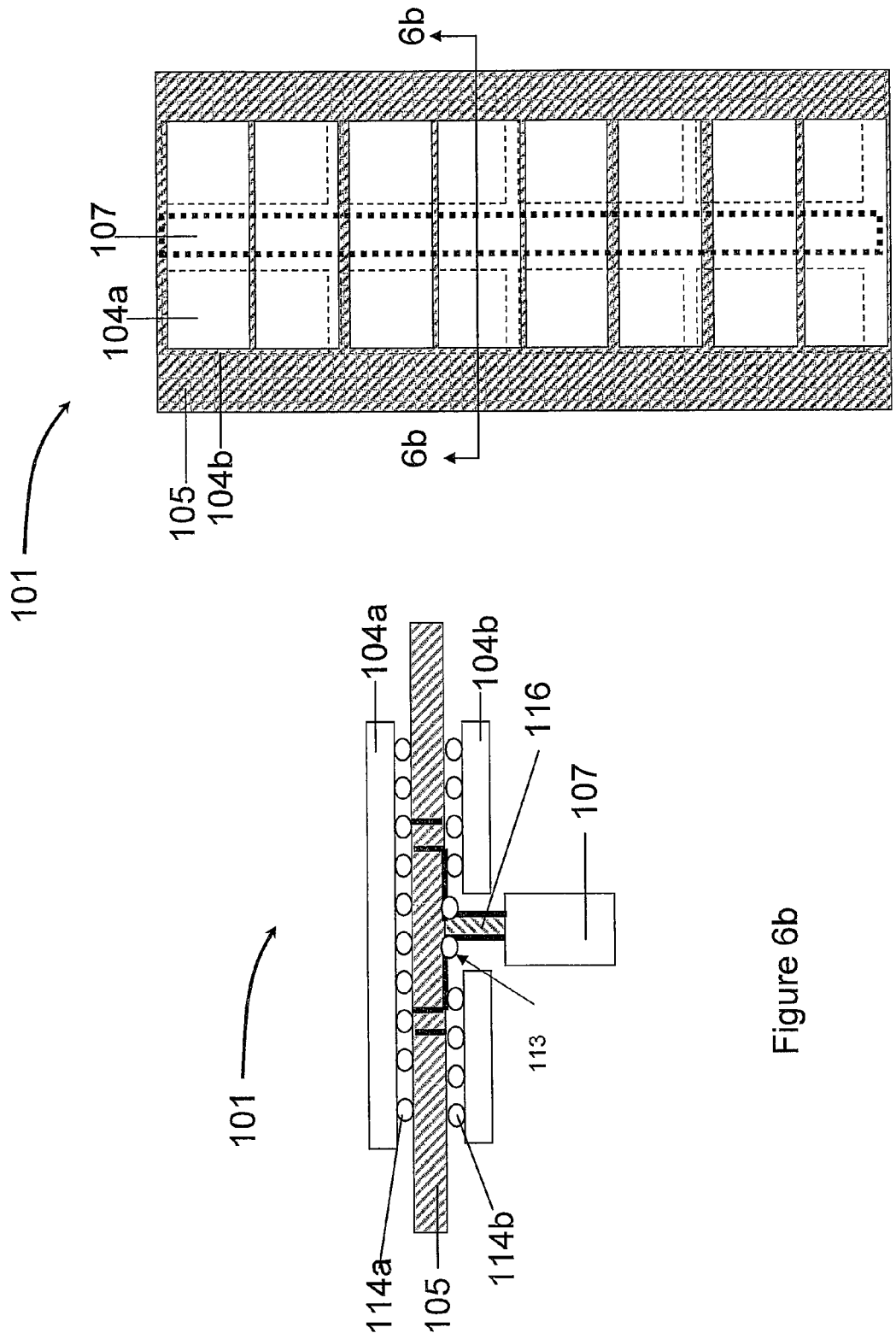

HORIZONTAL DUAL IN-LINE MEMORY MODULES

TECHNICAL FIELD

The present invention relates generally to a memory, and more particularly, to horizontal dual in-line memory modules (DIMMs).

BACKGROUND

Memory devices are used in many applications, such as computers, calculators, and cellular phones, as examples. Packaging of memory devices varies in different applications. For many years, single in-line memory modules (SIMMs) were used in computers. However, beginning with memory used for more recent 64-bit processors, dual in-line memory modules (DIMMs) have become more common. DIMMs have separate electrical contacts on each side of the module, while the contacts on SIMMs on both sides are redundant. DIMMs comprises an array of dynamic random access memory integrated circuits. The memory modules are mounted on a printed circuit board and designed for use in computing systems including hand held devices, laptops, personal computers, workstations and servers.

The DIMMs are coupled to the motherboard through connection pins located in a bottom edge. The number of pins varies based on the type of memory. For example, a 240 connector pin DIMM is used for double-data-rate two synchronous dynamic random access memory (DDR2 SDRAM), DDR3 SDRAM and FB-DIMM DRAM, whereas a 184 connector pin DIMM is used for DDR SDRAM.

Manufacturing semiconductor memory with increasing performance requires improving all aspects of the memory device. One of the bottlenecks in current memory performance is the length of the metal routings, for example, data lines within the DIMMs. The routing length between the memory chips and the DIMM connector cannot be reduced as wanted due to layout restrictions on the conventional DIMM. Routing or wiring through the circuit board within the DIMM is limited by the required arrangement of the pins. Hence, DIMMs with improved design that are compatible with existing standards and architectures are needed to overcome these limitations.

SUMMARY OF THE INVENTION

These and other problems are generally solved or circumvented, and technical advantages are generally achieved, by preferred embodiments of the present invention.

Embodiments of the invention include semiconductor memory modules. In accordance with a preferred embodiment of the present invention, a memory module comprises a circuit board, a plurality of memory chips attached to a top surface of the circuit board, a plurality of connector contacts disposed under a back surface of the circuit board and extending away from the memory chips, the connector contacts being electrically coupled to the memory chips, the back surface opposite the top surface of the first substrate.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2, which includes FIGS. 2a-2c, illustrates a memory module, wherein FIG. 2a illustrates a top view, FIG. 2b illustrates a cross sectional view, and FIG. 2c illustrates a side cross sectional view, in accordance with an embodiment of the invention;

FIG. 3, which includes

FIG. 5, which includes FIGS. 5a and 5b, illustrates a memory module, wherein FIG. 5a illustrates a top view and FIG. 5b illustrates a cross sectional view, in accordance with an embodiment of the invention;

FIG. 6, which includes FIGS. 6a and 6b, illustrates a memory module, wherein FIG. 6a illustrates a top view and FIG. 6b illustrates a cross sectional view, in accordance with an embodiment of the invention;

FIG. 7, which includes FIGS. 7a and 7b, illustrates a memory module, wherein FIG. 7a illustrates a top view and FIG. 7b illustrates a cross sectional view, in accordance with an embodiment of the invention;

FIG. 8, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a dual in-line memory module. The invention may also be applied, however, to other types of memory modules.

Figure 1:
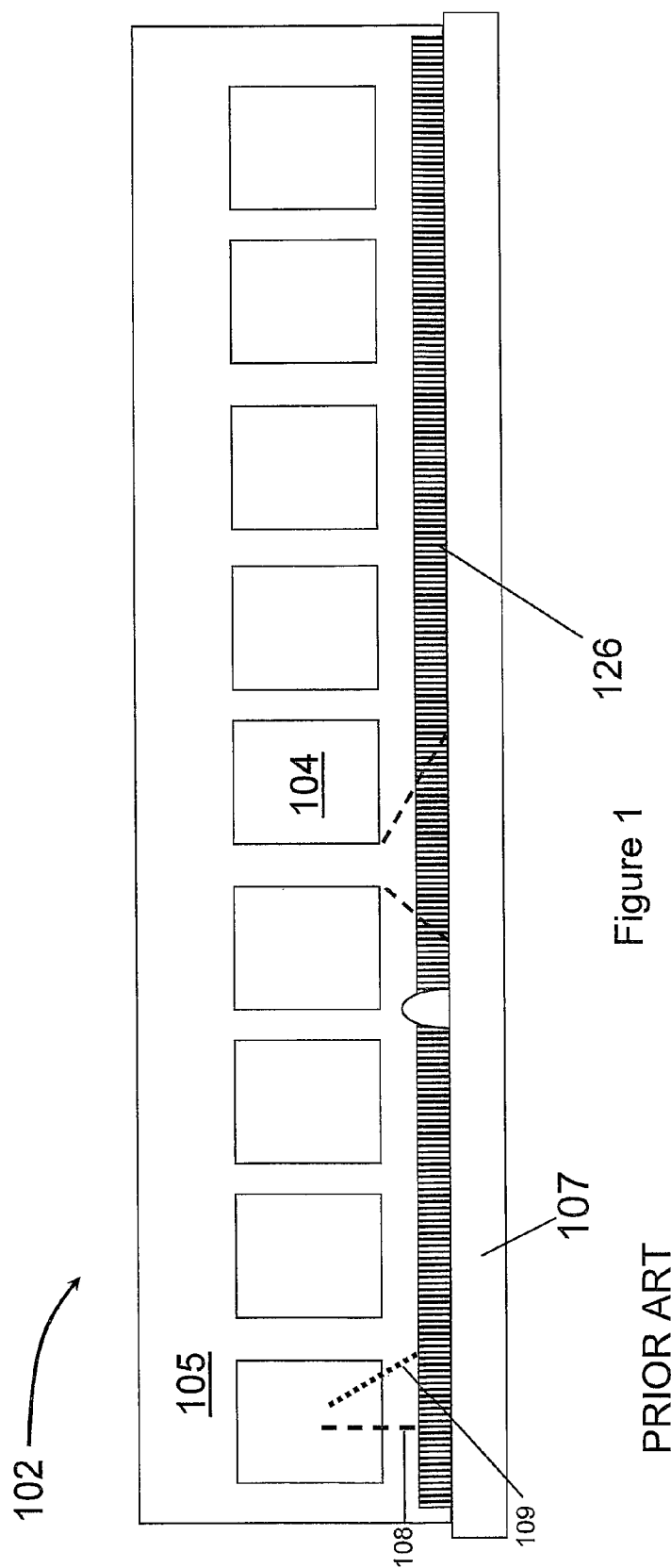
FIG. 1 illustrates a top view of a dual in-line memory module (DIMM)

FIG. 1 illustrates a known dual in-line memory module (DIMM) with contacts formed vertically. DIMM 102 includes a number of dynamic random access memory (DRAM) chips 104 (memory chips 104) attached to a circuit board 105. Connector pins 126 are disposed on a bottom edge of the circuit board 105, and the circuit board 105 includes wiring to connect the memory chips 104 to the connector pins 126. The DIMM 102 is connected to a memory socket 107 of a circuit board, e.g., a motherboard. The bottom edge also includes notches, for example, the location of each of the notches determines a feature of the module.

FIG. 1 also illustrates a sample wiring within the circuit board 105 to connect the memory chips 104, e.g., DRAM chips 104 to a memory socket 107. The data bus signaling on a multi slot data bus is limited by the wiring in the DIMM 102, for example, the stub length of each data line (DQ) stub in the circuit board 105. Referring to FIG. 1, first DQ stub 108 is directly above the appropriate contact of the memory socket 107, whereas second DQ stub 109 is spaced away from its contact on the memory socket 107. Consequently, the length of the second DQ stub 109 is considerably greater than the length of the first DQ stub 108. In a vertical DIMM arrangement as in FIG. 1, the DQ stubs (for example, the second DQ stub 109) are defined by the package size of the DIMM 102.

In various embodiments, the present invention overcomes these limitations by placing the connector pins 126 vertically under the circuit board 105 and forming the contacts below the memory chips 104. Using embodiments of the invention, the length of DQ stubs is significantly reduced relative to a vertical DIMM arrangement by placing the connector pins vertically.

An embodiment of the invention illustrating a structure of the memory module is described in FIG. 2. Further structural embodiments of the invention are illustrated in FIGS. 3-7. A method of fabricating the memory module is illustrated in FIG. 8 and the flow chart of FIG. 9.

Figure 2C:
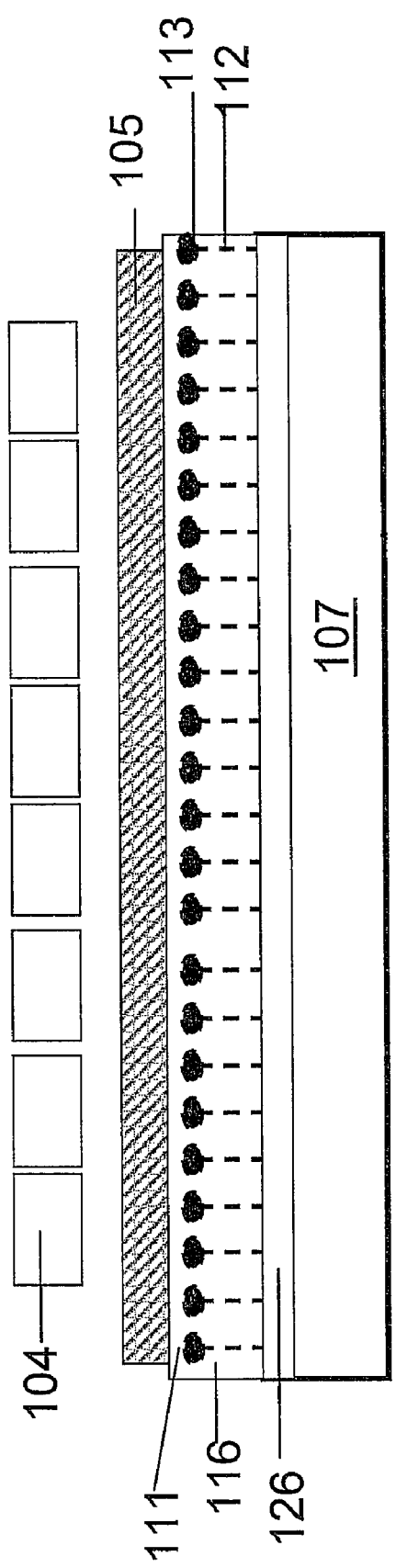

FIG. 2, which includes FIGS. 2a-2c, illustrates a memory module 101 in accordance with an embodiment of the invention. FIG. 2a illustrates a top view whereas FIGS. 2b and 2c illustrate a cross sectional view of the memory module 101.

Referring first to FIG. 2a, the memory chips 104 are arranged over the circuit board 105. The memory chips 104 are arranged as an array typically comprising four or eight chips. When attached to a motherboard of a computing system, the memory socket 107 (illustrated as dashed line as out of plane) is disposed below the circuit board 105, and hence in use the module will be arranged horizontally rather than vertically over the memory socket 107.

Referring to FIG. 2b, the memory chip 104 is coupled to the circuit board 105 through suitable interposer 114. This interposer 114 can use any suitable bonding means. Examples include solder balls, solder paste, and conductive epoxy, for electrically and physically coupling the memory chip 104 with the circuit board 105. In other embodiments, the electrical connection and physical coupling can be made using different means. For example, the memory chip 104 can be glued to the circuit board 105 while wire bonds electrically couple the memory chip 104 to the circuit board 105. A molding compound may additionally surround a portion of the interposers 114, the memory chips 104 and the circuit board 105.

The circuit board 105 comprises a material suited for forming printed circuit boards. Examples of materials forming the circuit board 105 include glass fiber laminate based on synthetic resin or reinforced epoxy resin.

The circuit board 105 further comprises vias for electrically coupling the top surface to an opposite bottom surface of the circuit board 105. The vias 117 comprise either micro vias and/or through board vias. FIG. 2b illustrates an embodiment showing through board vias. Alternately, an array of micro vias may be used if metal lines (e.g., wiring lines 115) are formed over multiple levels within the circuit board 105.

The circuit board 105 further comprises metal lines, for example, wiring lines 115 for coupling the vias 117 in a direction perpendicular to the direction of the vias 117. The wiring lines 115 are disposed within or on the surfaces of the circuit board 105. A portion of the wiring lines 115 disposed on the top surface of the circuit board 105 electrically couple the vias 117 to the interposers 114.

The circuit board 105 is physically attached to the memory socket 107 through the connector circuit board 116. A bottom portion of the wiring lines 115 disposed on the bottom surface of the circuit board 105 couple the vias 117 to the connector circuit board 116. The circuit board 105 is electrically coupled to the memory socket 107 through metal routing lines 112 on the connector circuit board 116. The connector circuit board 116 further comprises micro vias and/or through board vias in coupling the metal routing lines 112 to the memory socket 107.

In the illustrated embodiment, the connector circuit board 116 is physically attached into a notch 111 in the circuit board 105. In another embodiment, the connector circuit board 116 is attached onto a planar surface of the circuit board 105. In one embodiment, the connector circuit board 116 is bonded to the circuit board 105 through a suitable adhesive, for example, thermosetting adhesives such as epoxy, polyimide or silicone containing adhesive. In various embodiments, the connector circuit board 116 comprises a material similar to the circuit board 105. For example, in one embodiment the connector circuit board 116 comprises a glass fiber laminate based on synthetic resin or an epoxy resin reinforced with a woven glass cloth.

In one embodiment, the outer layer of the connector circuit board 116 comprises the metal routing lines 112. The metal routing lines 112 are coupled to the wiring lines 115 on the circuit board 105. In one embodiment, the electrical and physical coupling of the metal routing lines 112 on the connector circuit board 116 to the wiring lines 115 is accomplished through solder 113 (FIG. 2b).

As illustrated in FIG. 2c, in one embodiment, the output pins (connector pins 126) on the connector circuit board 116 are arranged similar to a standard DIMM or SIMM and attachable to a standard memory socket 107. In one embodiment, the output pins on the connector circuit board 116 are arranged as in a joint electron device engineering council double-data-rate three (JEDEC DDR3) or higher synchronous dynamic random access memory. In various embodiments, the memory chips 104 are arranged perpendicular to the connector circuit board 116, and over the circuit board 105.

The memory chips 104 are preferably DRAM chips, although alternatively, other types of memory devices could also utilize concepts of the present invention. The DRAM chips may comprise synchronous DRAM chips, each DRAM chip including at least 256 million memory cells, as one example. For example, 1 Gbit or 2 Gbit DDR SDRAM chips can be included in the DIMM 102. In the illustrated example, a 64-bit data bus can be achieved by including eight x8 chips arranged in two layers in one embodiment. In another embodiment, more than one rank can be included in a module so that some of the data pins for different memory chips are connected in parallel. The memory chips 104 in various embodiments can be packaged chips or bare dies.

The memory socket 107 comprises openings for attaching outpins of the connector circuit board 116. The number of openings of the memory socket 107 may be the same as, or greater than, the number of pins on the connector circuit board 116. As an example, a memory socket 107 may include one hundred or more pins, e.g., over two hundred in some embodiments. For example, the memory socket 107 has 240 openings for a known 240-pin DIMM used for DDR2 SDRAM, DDR3 SDRAM and FB-DIMM DRAM.

Figure 3A:
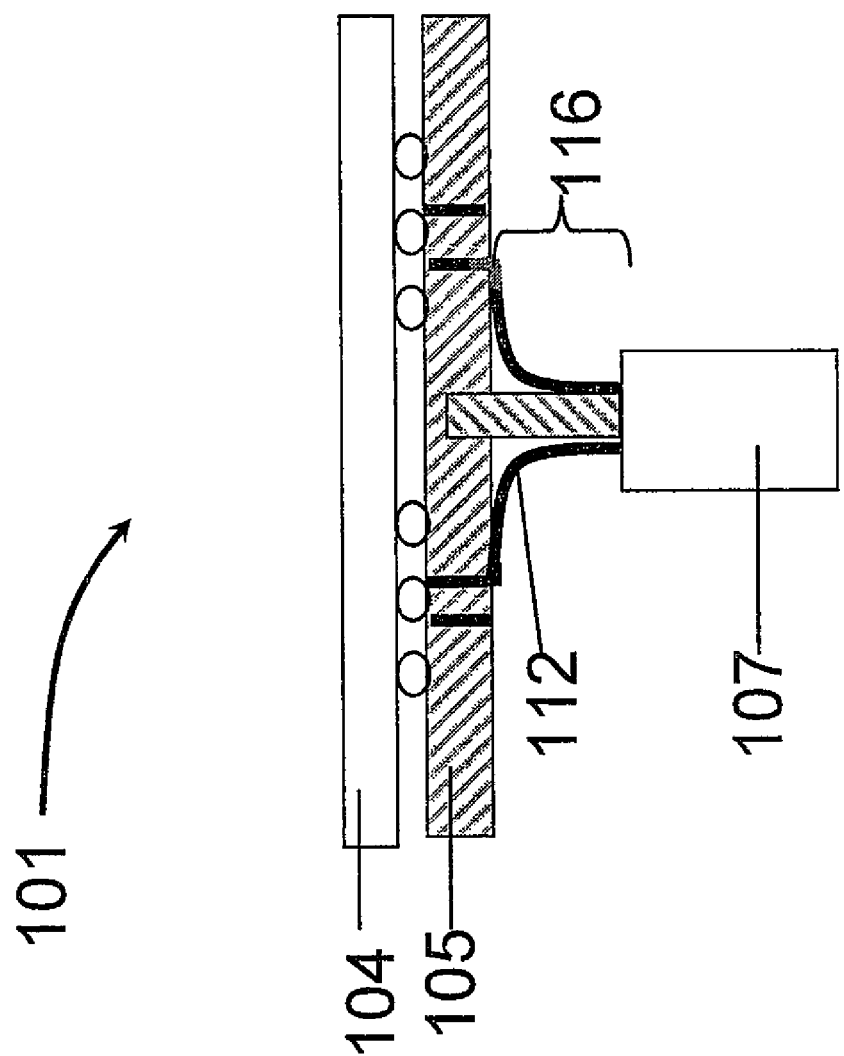
FIGS. 3a and 3b, illustrates a memory module, in accordance with an embodiment of the invention.
Figure 3B:
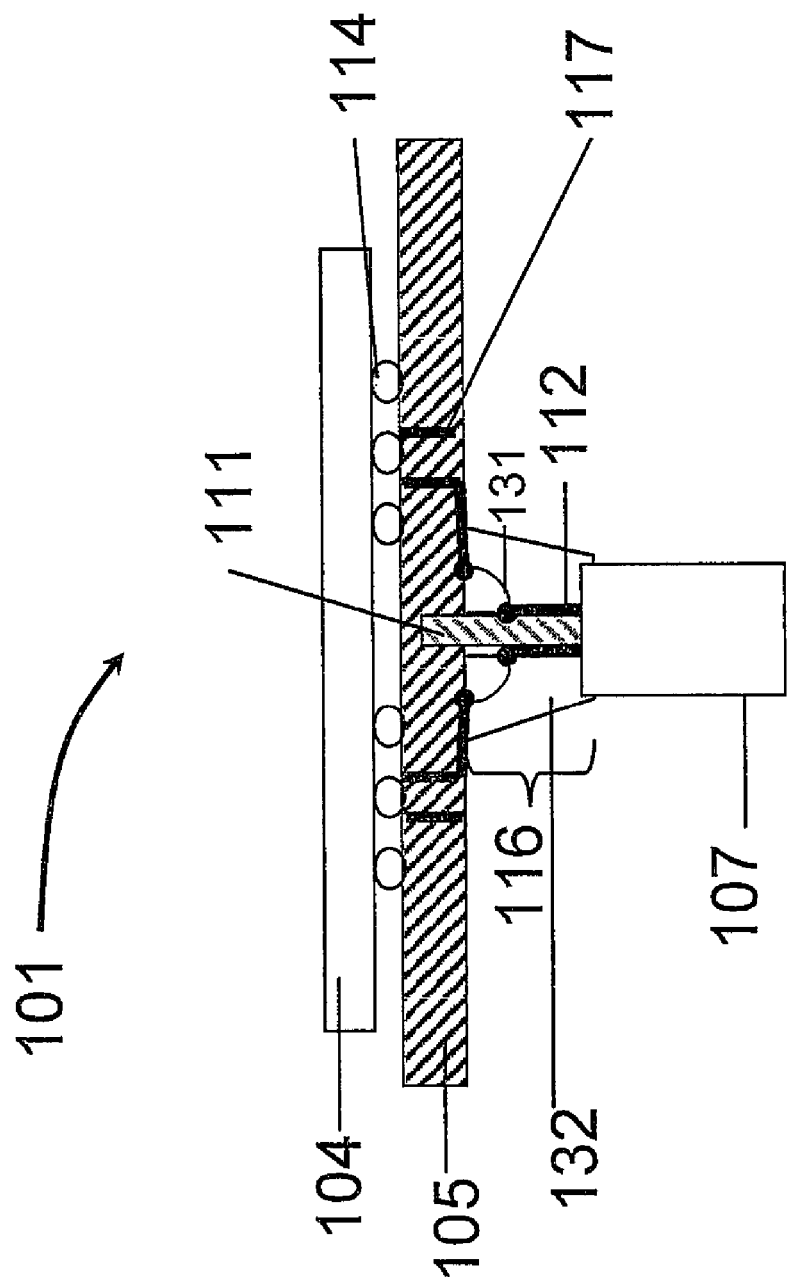

FIG. 3, which includes FIGS. 3a and 3b, illustrates embodiments of the interconnection between the circuit board and the connector circuit board, in accordance with embodiments of the invention.

FIG. 3a illustrates an embodiment of the invention using flexible metal routing lines 112. Although the top view is similar to the prior embodiment (FIG. 2a), the cross sectional view illustrates flexible metal routing lines 112. Consequently, solder 113 is not used as in the prior embodiments. In one embodiment, the flexible metal routing lines 112 overlap with a metal line on the back surface of the circuit board 105. The electrical coupling is achieved in this overlapping zone by a suitable adhering process. For example, in one embodiment, the connector circuit board 116 is first fabricated comprising metal routing lines 112. The metal routing lines 112 to be coupled to the circuit board 105 are formed extending vertically away from its surface.

The extending part of the metal routing lines 112 is aligned with a corresponding part of the wiring lines 115 using a suitable aligning technique. In one embodiment, the wiring lines 115 and the metal routing lines 112 are pressed together forming a bond, for example, under high temperatures. In one embodiment, the wiring lines 115 and the metal routing lines 112 may comprise different materials that solder together when pressed together and heated. Examples of such soldering include joining wiring lines 115 comprising copper with metal routing lines 112 comprising tin. A copper tin eutectic bond is formed coupling the metal routing lines 112 with the wiring lines 115. In other embodiments, tin silver eutectic, gold tin eutectic, or copper silver tin eutectic may be used. A molding compound 132 may be optionally formed over the joined metal routing lines 112 and the wiring lines 115.

In another embodiment as illustrated in FIG. 3b, a bonding region is included at the intersection of the connector circuit board 116 with the circuit board 105 to protect against large mechanical stresses. Wire bridges 131 are disposed within the bonding region to electrically couple the metal routing lines 112 on the connector circuit board 116 to the wiring lines 115 on the circuit board 105. This type of contacting effectively compensates large lateral displacements of the circuit board 105 and/or the connector circuit board 116 due to mechanical impacts as well as thermal expansion. Despite large displacements, the wire bridges 131 maintain good electrical connectivity. A molding compound 132 is formed over the wire bridges 131 to protect them during the lifetime of the product.

By placing the memory chips 104 horizontally over the memory board, the embodiments described above utilize more area over the motherboard than vertical DIMMs. This is because the footprint (area or length over the motherboard) of the memory module as described is defined by the dimensions of all the memory chips. The footprint may be reduced further using embodiments described below, which use stacking the memory chips 104 or an interleaved formation as will be described in detail below with respect to the embodiments of FIGS. 4, 5, 6, and 7.

Figure 4:
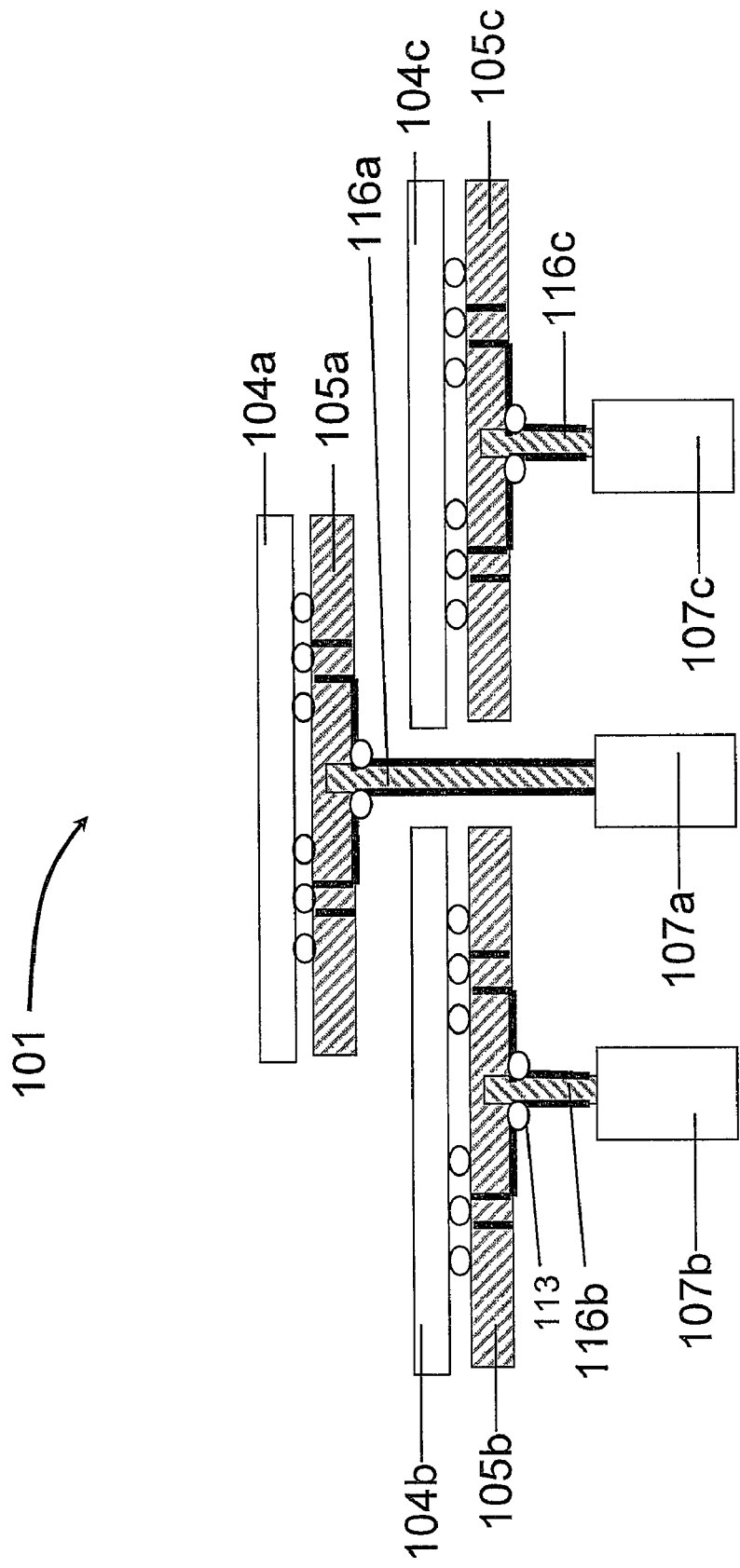
FIG. 4 illustrates a memory module, in accordance with an embodiment of the invention.

FIG. 4 illustrates an embodiment of a memory module illustrating an interleaved arrangement, in accordance with an embodiment of the invention. In this embodiment, the memory chips 104 are attached over multiple circuit boards 105 and each one of these circuit boards 105 is coupled to a memory socket 107. However, to reduce the footprint, some of the circuit boards 105 and memory chips 104 are formed on multiple levels. In various embodiments, the footprint is reduced by an enhanced effective usage of vertical dimension over a motherboard of a computing system. In various embodiments, this interleaved arrangement reduces the footprint of the DIMM array over the motherboard. The embodiment described below illustrates three modules although in other embodiments more modules may be used.

FIG. 4 illustrates one embodiment wherein a first memory chip 104a is disposed over a first circuit board 105a forming a first memory module. Similarly, a second memory module and a third memory module are formed by stacking a second memory chip 104b over a second circuit board 105b, and a third memory chip 104c over a third circuit board 105c. The first circuit board 105a is coupled to the first memory socket 107a through first connector circuit board 116a. Similarly, the second circuit board 105b, and the third circuit board 105c, are coupled to the second and the third memory sockets 107b and 107c, respectively, through second and third connector circuit boards 116b and 116c, respectively. However, the first circuit board 105a is disposed on a different vertical level relative to the second circuit board 105b and the third circuit board 105c. The length of the first connector circuit boards 116a is longer than the length of the second and the third connector circuit board 116b and 116c. However, to offset this difference, the wiring lines within the first connector circuit board 11 6a are routed through a longer pathway to minimize this difference between the first circuit board 105a to the second circuit board 105b and the third circuit board 105c.

In FIG. 4, the first circuit board 105a is coupled through a first connector circuit board 116a that is longer than the second and third connector circuit boards 116b and 116c. However, in other embodiments, the first, the second, and the third connector circuit boards 116a, 116b, and 116c comprise an identical length. However, a connector pin is coupled to the first connector circuit board 116a, thus suitably extending the distance between the first circuit board 105a and the memory sockets 107a. Using this embodiment advantageously requires manufacturing only a single configuration of memory modules while still loading them over a motherboard with increased density.

Although not shown, in some embodiments, further vertical integration is accomplished by forming connectors of a third length longer than the first connector circuit board 116a for forming a third level of memory modules. Further, although the first, the second, and the third connector circuit boards 116a, 116b, and 116c are coupled to the circuit board 105 using solder 113, in other embodiments other types of connectors may be used as described with respect to FIG. 3.

Figure 5B:
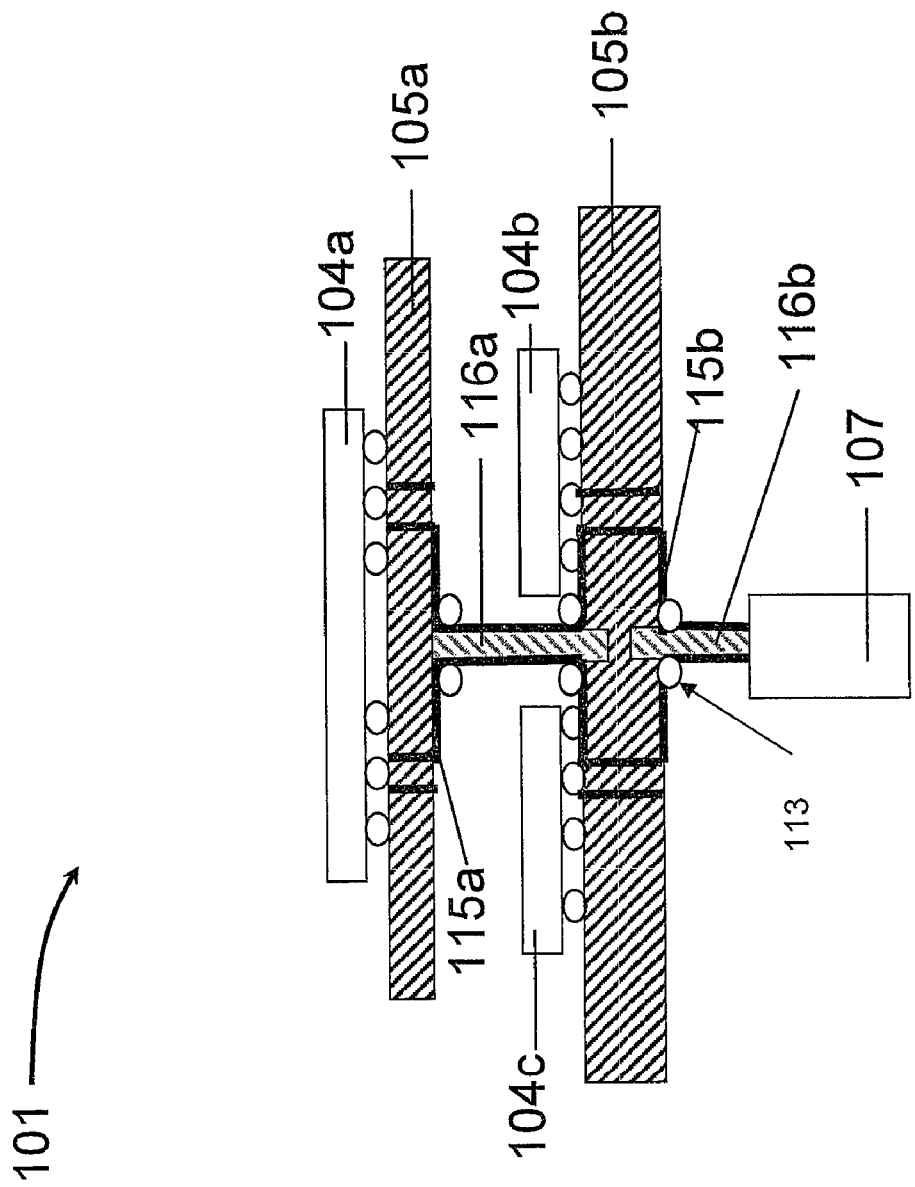

FIG. 5, which includes FIGS. 5a and 5b, illustrates an embodiment in which multiple memory modules are stacked over each other. In the embodiment illustrated in FIG. 5, only two memory modules are shown, although in other embodiments more memory modules may be stacked. Referring to FIG. 5b, a first memory chip 104a is disposed over a first circuit board 105a. Similarly, a second memory chip 104b is disposed over a first portion of a second circuit board 105b, and a third memory chip 104c is disposed over a second portion of the second circuit board 105b. The first and the second circuit boards 105a and 105b are coupled together using a first connector circuit board 116a.

As in prior embodiments, first metal routing lines 112a within the first connector circuit board 116a couple to first wiring lines 115a within the first circuit board 105a. Similarly, second metal routing lines 112b within the second connector circuit board 116b are coupled to second wiring lines 115b with the second circuit board 105b. Connector pins on first circuit board 116a couple to the socket line openings on the top surface of the second circuit board 105b.

In other embodiments, more than two levels of memory chips are disposed over the memory socket 107, each of the memory chips being coupled by an intermediate connector circuit board. Similarly, to increase packing efficiency, in other embodiments, additional memory chips may be disposed under the second circuit board 105b, using, for example, embodiments as described below with respect to FIG. 6.

The memory module as illustrated in FIG. 5 is fabricated by first forming an integral circuit board and then affixing the memory chips. Individual steps are illustrated in more detail in one embodiment of FIG. 8. In this embodiment, the integral circuit board comprises multiple levels. Hence, a first connector circuit board 116a is attached to the first circuit board 105a. Similarly, a second connector circuit board 116b is attached to the second circuit board 105b. The socket-like openings are formed on the second circuit board 105b coupling to the metal lines disposed within the second circuit board 105b. In some embodiments, these openings are formed and interconnected with the metal lines within the second circuit board 105b before attaching the second connector circuit board 116b to the second circuit board 105b.

The free end of the first connector circuit board 116b is attached to the top surface of the second circuit board 105b, thus forming the integral circuit board. After forming the integral circuit board, the first and the second memory chips 105a and 105b are attached to the integral circuit board forming the memory module.

FIG. 6, which includes FIGS. 6a and 6b, illustrates a memory module comprising DRAM chips disposed on both sides of a circuit board, in accordance with an embodiment of the invention. FIG. 6a illustrates a top view, and FIG. 6b illustrates a cross sectional view of the memory module.

Referring to FIG. 6a, first memory chips 104a are disposed over a top surface of the circuit board 105, while second memory chips 104b are disposed under a bottom surface of the circuit board 105. The first and second memory chips 104a and 104b are coupled to a memory socket 107 through the circuit board 105. The circuit board 105 is attached to the memory socket 107 using the connector circuit board 116. Referring to FIG. 6b, the first and the second memory chips 104a and 104b are coupled to the circuit board 105 through interposers 114. Although the connector circuit board 116 is coupled to the circuit board 105 using solder 113, in other embodiments other connectors may be used as described for example with respect to FIG. 3. In FIG. 6a, the first memory chips 104a are oriented perpendicular to the second memory chips 104b. In other embodiments, the first and the second memory chips 104a and 104b may be aligned parallel to each other, and thus not disposed in a central area under and over the circuit board 105.

The memory module, as illustrated in FIG. 6, is fabricated by first forming an integral circuit board, and then attaching the memory chips. Individual steps are illustrated in more detail in one embodiment of FIG. 8. Hence, a connector circuit board 116 is attached to the circuit board 105. The first memory chip 104 is attached to the top surface of the circuit board 105 using first interposers 114a while the second memory chip 104b is affixed to a bottom surface of the circuit board 105 using second interposers 114b (FIG. 6b).

Figure 7A:
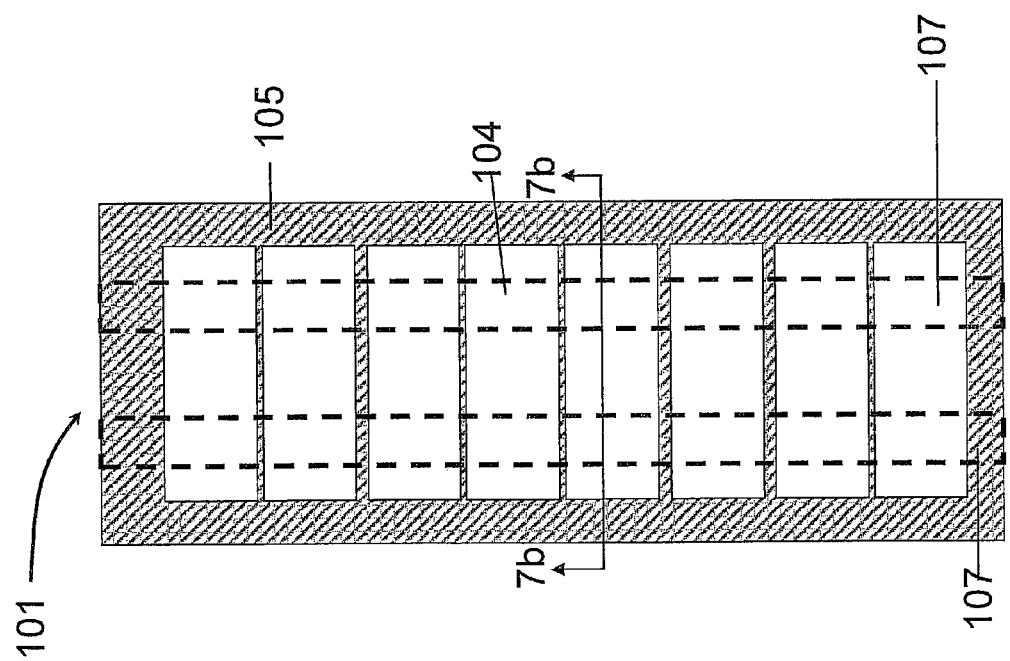
Figure 7B:
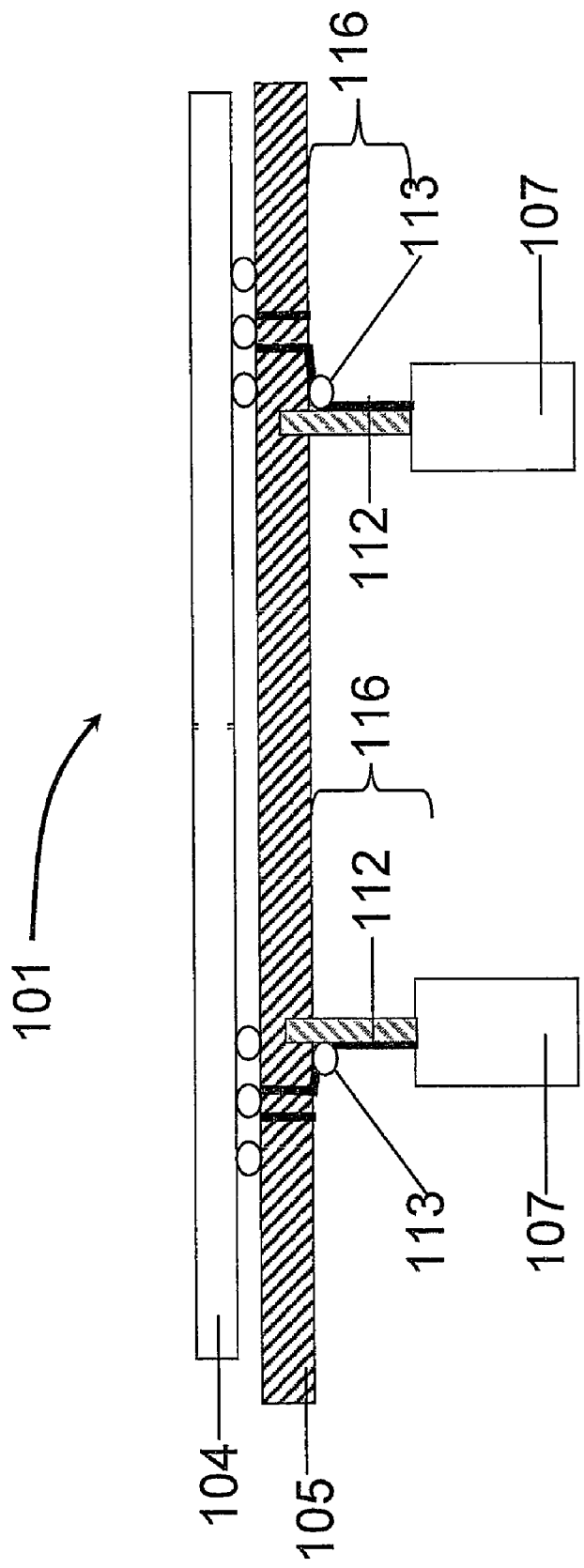

FIG. 7, which includes FIGS. 7a and 7b, illustrates a memory module comprising DRAM chips, wherein the module is attached to more than one socket, in accordance with an embodiment of the invention. FIG. 7a illustrates a top view, and FIG. 7b illustrates a cross sectional view of the memory module.

In this embodiment, multiple rows of connector circuit boards 116 are disposed under the circuit board 105. The metal routing lines 112 in the multiple rows of connector circuit boards 116 are coupled to the wiring lines 115 of the circuit board 105 as in other embodiments. The memory chip 104 is disposed over the circuit board 105 as described in prior embodiments. However, use of multiple rows of connector circuit boards 116 enables minimizing the length of the DQ stubs in the circuit board, and also may be advantageous for other reasons. For example, using multiple DIMM sockets may be useful to improve heat transfer away from the memory chip 104 and/or provide mechanical stability.

In various embodiments, the invention solves the problem of reducing the length of the DQ lines by changing the orientation of the DQ lines and connector pins in the DIMM while still being compatible with standard DIMM designs. Unlike a vertical DIMM design, in the horizontal design, the minimum DQ stub length is not defined by the package size. Even for devices with a predefined package outline, embodiments of the invention reduce the stub length enabling significant improvements in DIMM routing.

The embodiment illustrated in FIG. 7 is fabricated, in one embodiment, using the steps detailed below regarding FIG. 8. However, multiple rows of connector circuit boards are formed.

Figure 8A:
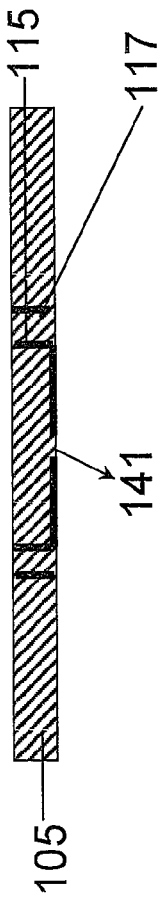
FIGS. 8a-8e, illustrates a memory module at various stages of processing during fabrication in accordance with embodiments of the invention.

FIG. 8, which includes FIGS. 8a-8e, illustrates a memory module at various stages in the fabrication process, in accordance with an embodiment of the invention. FIG. 9 illustrates a flow chart describing the method of fabrication of the memory module of FIG. 8, in accordance with embodiments of the invention.

The circuit board 105, the connector circuit board 116, and the memory chip 104 are first individually formed as illustrated in box 210 of the flow chart of FIG. 9. As illustrated in FIG. 8a, the circuit board 105 comprises a suitable area (region 141) for attaching the connector circuit board 116. The connector circuit board 116 as formed comprises output pins that are attachable to a memory socket, for example, a DDR4 memory socket.

Figure 8B:
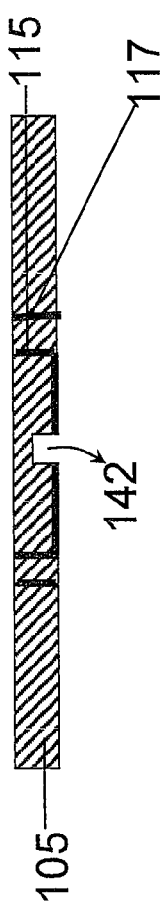
Figure 8C:
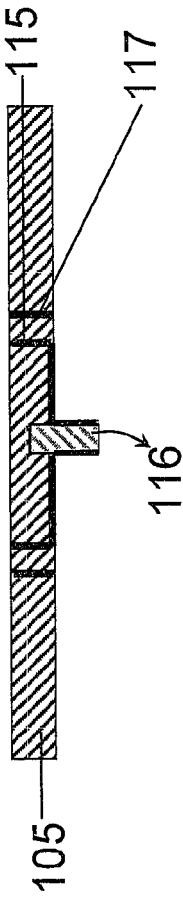
Figure 9:
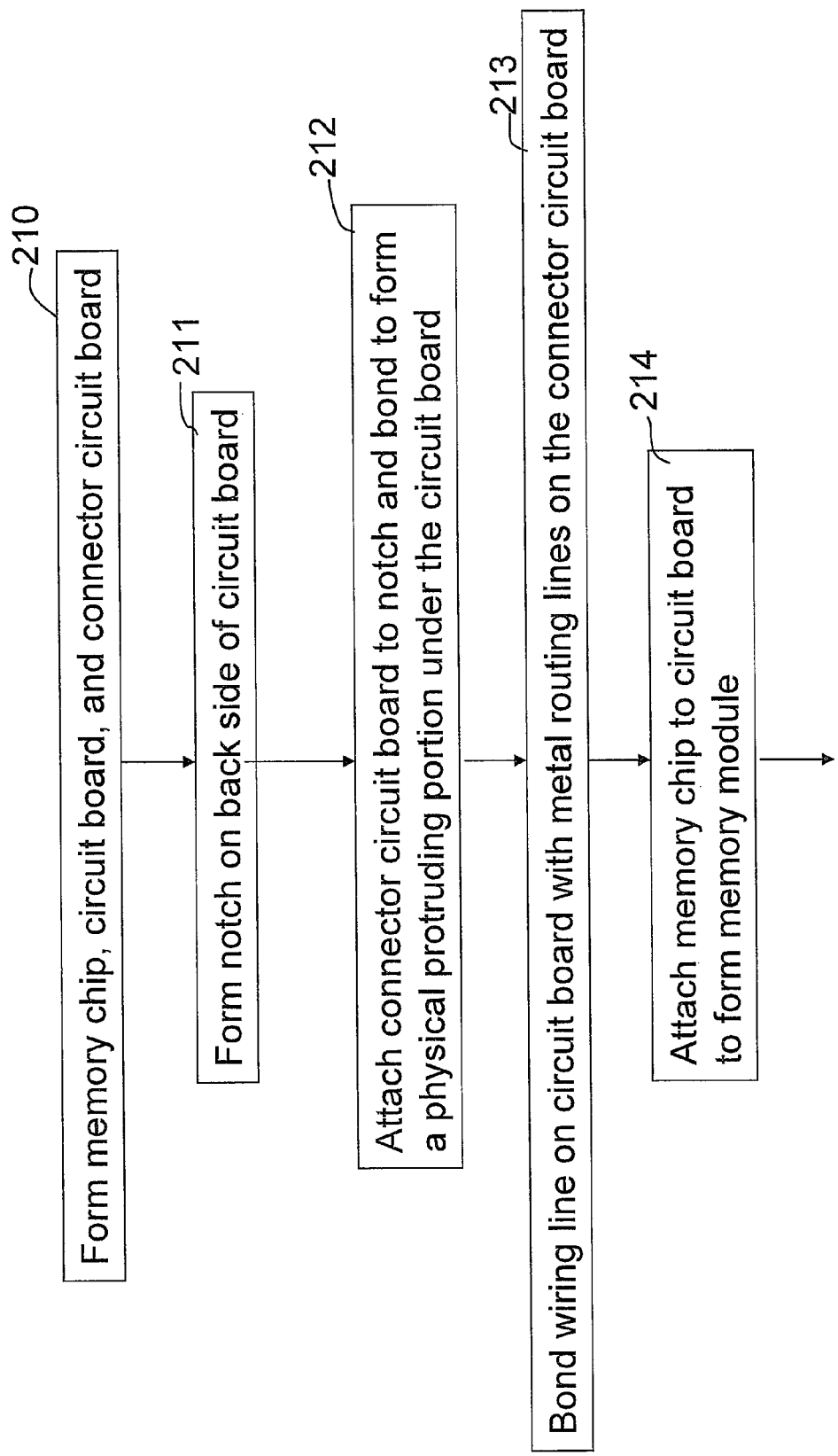
FIG. 9 illustrates a flow chart of a method of fabrication of the memory module as illustrated in FIG. 8, in accordance with embodiments of the invention.

As described in box 211 of FIG. 9, a notch 142 or trench is formed on the back side of the circuit board 105 (FIG. 8b). After individually forming the circuit board 105 and the connector circuit board 116, they are bonded together forming an integral circuit board. In one embodiment, a layer of adhesive is deposited over the back side of the circuit board 105 such that at least a portion of the notch 142 is filled with the adhesive. For example, the adhesive may comprise a thermosetting adhesive such as an epoxy resin, silicon, or polymide containing adhesive. As illustrated in FIG. 8c and box 212 of FIG. 9, the connector circuit board 116 is subsequently positioned over the notch 142. Using suitable means, the connector circuit board 116 is bonded to the circuit board 105. For example, in the case of thermosetting adhesives, the connector circuit board 116 may be heated to a specific temperature while pressed together with the circuit board 105, thereby forming a permanent bond.

Figure 8D:
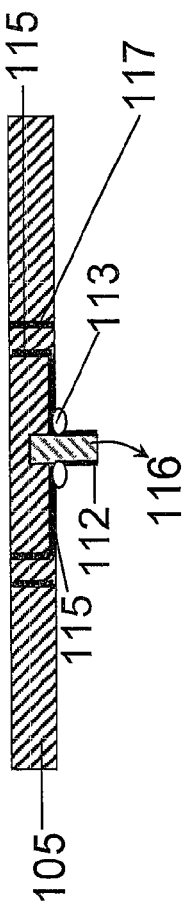

An integral circuit board comprising the circuit board 105 and the connector circuit board 116 is formed. Referring to FIG. 8d and box 213 of FIG. 9, solder 113 is applied to electrically couple the metal routing lines 112 of the connector circuit board 116 to the wiring lines 115 of the circuit board 105. If a vertical wiring scheme is adopted as illustrated in FIG. 2b, a solder 113 is used. If however, a flexible wiring is adopted as in FIG. 3a, the wiring may be joined, for example, using higher pressure and/or temperature to fuse the flexible wiring to the metal wirings on the circuit board. Alternately, in the case of wire bridges as in FIG. 3b, wire bonding techniques may be used to form a wire bond between the circuit board 105 and the connector circuit board 116.

In other embodiments, other suitable means may be adopted to form the connector circuit board 116. For example, in one embodiment, a sacrificial material may be deposited and selectively removed to form openings over the notch. A dielectric material may be filled into the notch and the openings formed over the notch. After filling the notch and the openings, the sacrificial material is removed leaving a connector. The metal routing lines are subsequently placed over the exposed dielectric material to form the connector circuit board 116. In such embodiments, the connector circuit board 116 is formed during the fabrication of the memory module.

Figure 8E:
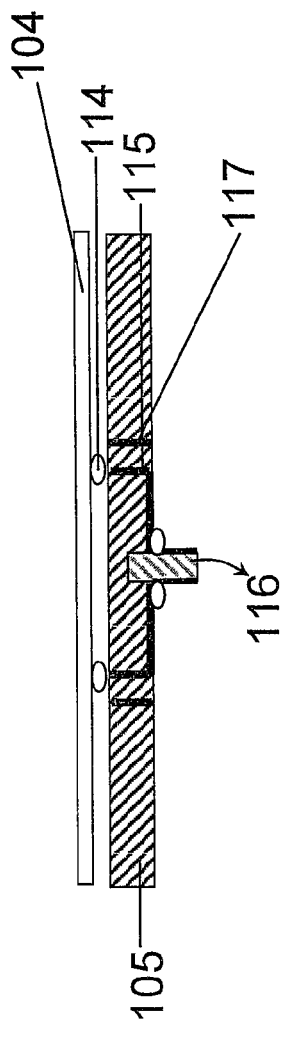

The method proceeds with the attachment of the memory chip to the circuit board (FIG. 8e and box 214 of FIG. 9). The memory chip 104 is bonded to the circuit board 105 (as illustrated in FIG. 2b). In various embodiments, any suitable technique may be used in forming the memory module. Examples include wire bonding, flip chip bonding, as well as combinations that include flip chip and wire bonding methods.

Figure 10:
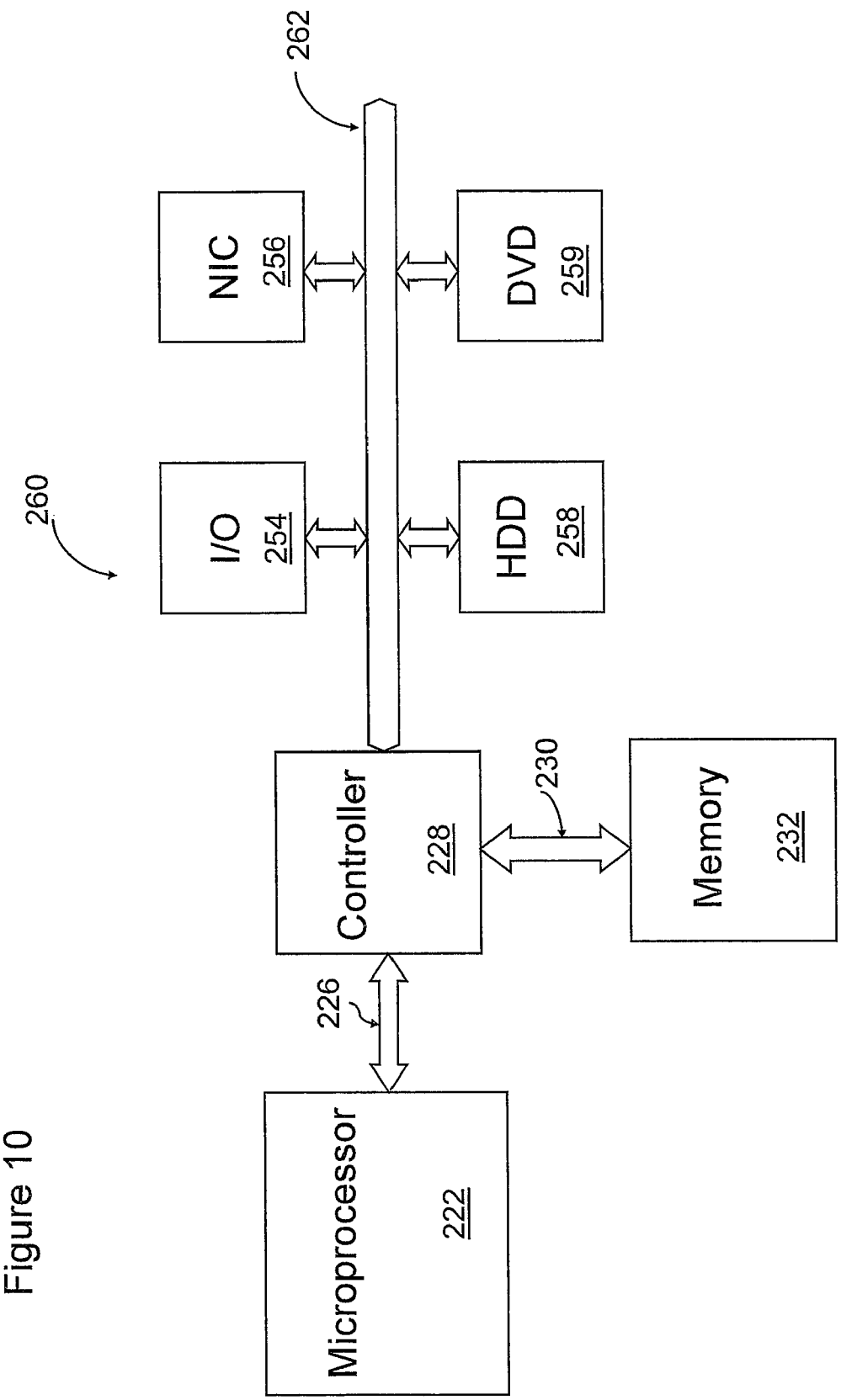
FIG. 10 illustrates a block diagram of a computer system implemented with a memory module in accordance with embodiments of the invention.

A block diagram of the computing system 260 comprising a memory module using embodiments of the invention is illustrated in FIG. 10. The computer system 260 includes a microprocessor 222, which is coupled to the controller 228 via microprocessor bus 226. In this example, controller 228 serves the combined purpose of serving as a memory controller and also as a bus interface controller or bridge (e.g., north bridge). In other systems, separate devices could be used for these tasks.

A central bus 262 is coupled to a number of components and communicates with the microprocessor 222 via the controller 228. Four examples of components that can be coupled to the central bus 262 are shown, i.e., user input/output 254 (which could include a display, mouse, keyboard, microphone or other), network interface card 256, hard disk drive 258, and DVD drive 259. These examples are provided only to show the types of devices that can be utilized in a computing system 260. Other busses or components could be used.

The microprocessor 222 may comprise the CPU of the computing system 260, for example. In one embodiment, a memory module 232 comprises a DRAM memory module as described in the prior embodiments above. The memory module 232, being compliant with memory standards, for example, JEDEC standards that define the pin configuration, is attached to a socket on the motherboard of the computing system. The memory module 232 may comprise other types of memories along with the DRAM memory modules. A memory bus 230 connects the controller 228 and the memory module 232.

Embodiments described above have been directed to DRAM DIMMs, but in other embodiments can be any circuit board. Similarly, other types of memory modules besides DIMMs may be used in other embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory module comprising:
   a circuit board;
   a plurality of memory chips attached to a top surface of the circuit board; and
   a plurality of connector contacts disposed under a back surface of the circuit board and extending away from the memory chips, the connector contacts being electrically coupled to the memory chips, the plurality of connector contacts being aligned parallel to a normal to the back surface of the circuit board, the back surface opposite the top surface of the circuit board, wherein the circuit board, the plurality of memory chips, and the plurality of connector contacts form the memory module.

2. The memory module of claim 1, wherein the plurality of connector contacts is beneath at least one of the memory chips, wherein the plurality of connector contacts is centrally located under the back surface of the circuit board.

3. The memory module of claim 1, wherein the connector contacts are disposed on a connector substrate, the connector substrate being attached to and substantially perpendicular with the circuit board.

4. The memory module of claim 3, further comprising an extender connector removably coupled to the connector substrate.

5. The memory module of claim 3, wherein the connector substrate is disposed at least partially within the circuit board.

6. The memory module of claim 5, wherein the connector substrate is disposed within a groove in the circuit board.

7. The memory module of claim 5, wherein conductive regions of the connector substrate are electrically connected to conductive regions on the circuit board by solder.

8. The memory module of claim 5, wherein conductive regions of the connector substrate are electrically connected to conductive regions on the circuit board by a flexible conductor.

9. The memory module of claim 5, wherein the circuit board and the connector substrate are formed from a same material.

10. The memory module of claim 1, wherein the connector contacts comprise a row of connectors located substantially along a line under the back surface of the circuit board.

11. The memory module of claim 10, wherein the row of connectors comprises a row of double connectors.

12. The memory module of claim 1, wherein the connector contacts comprise a first row of connector contacts and a second row of connector contacts under the back surface of the circuit board, the first row being spaced from the second row.

13. The memory module of claim 1, wherein the connector contacts are physically and electrically configured to be compatible with a JEDEC DDR4 memory socket specification.

14. The memory module of claim 1, further comprising a second plurality of memory chips attached to the back surface of the circuit board.

15. The memory module of claim 14, wherein the second plurality of memory chips includes at least a first memory chip and a second memory chip, the connector contacts being laterally disposed between the first and second memory chips along the back surface of the circuit board.

16. The memory module of claim 14, wherein:
the connector contacts are arranged in a row;
each memory chip of the plurality of memory chips is aligned with long edge substantially perpendicular to the row of connector contacts; and
each memory chip of the second plurality of memory chips is aligned with long edge substantially parallel to the row of connector contacts.

17. A memory module comprising:
a substrate;
a plurality of memory chips disposed on a top surface of the first substrate; and
a connector substrate having an edge surface physically coupled to a bottom surface of the first substrate such that the connector substrate is aligned substantially parallel to the normal to the top surface, wherein each of the memory chips is electrically coupled to the connector substrate through the first substrate, the substrate, the plurality of memory chips, and the connector substrate forming the memory module.

18. The memory module of claim 17, wherein the first substrate and the connector substrate comprise printed circuit boards.

19. The memory module of claim 17, wherein the connector substrate comprises connector pins, the connector pins configured to be attached to a memory socket.

20. The memory module of claim 17, further comprising a second plurality of memory chips disposed on the bottom surface of the first substrate.

21. The memory module of claim 17, wherein each of the memory chips is electrically coupled to the connector substrate through a solder joint, the solder joint physically attaching the first substrate and the connector substrate.

22. A computing system comprising:
a socket disposed on a motherboard; and
a memory module coupled to the socket, the memory module comprising:
a circuit board with a top surface that is arranged along a plane that is substantially parallel to the motherboard,
a plurality of memory chips disposed on the top surface of the circuit board, and
a plurality of socket connectors that extend away from a bottom surface of the circuit board and are electrically connected to the socket, the bottom surface being opposite to the top surface, the plurality of socket connectors being aligned parallel to a normal to the bottom surface of the circuit board, wherein the circuit board, the plurality of memory chips, and the plurality of connector contacts form the memory module.

23. The system of claim 22, wherein the socket connectors are electrically connected to the socket through an intermediate connector, the intermediate connector being physically coupled to the socket connectors and the socket.

24. The system of claim 22, wherein the socket connectors comprise male/female connectors.

25. The system of claim 22, further comprising:
a microprocessor disposed on the motherboard; and
a memory controller disposed on the motherboard, the microprocessor being functionally coupled to the memory module through the memory controller.

26. The system of claim 25, wherein the socket connectors are aligned substantially perpendicular to the bottom surface of the circuit board.

27. The system of claim 22, further comprising:
a second socket disposed on the motherboard; and
a second memory module coupled to the second socket, the second memory module comprising:
a second circuit board with a top surface that is arranged along the plane that is substantially parallel to the plane of the motherboard,
a second plurality of memory chips disposed on the top surface of the second circuit board, and
a second plurality of socket connectors that extend away from a bottom surface of the second circuit board and are electrically connected to the second socket, the bottom surface being opposite to the top surface.

28. The system of claim 27, wherein the second plurality of memory chips are farther from the motherboard than the plurality of memory chips.

29. A method of making a memory module, the method comprising:
attaching memory chips over a top surface of a circuit board, the top surface being opposite a back surface; and
attaching a connector circuit board to the back surface of the circuit board, the connector circuit board not contacting the top surface of the circuit board, the connector circuit board being oriented substantially perpendicular to the circuit board.

30. The method of claim 29, wherein attaching the connector circuit board to the back surface of the circuit board comprises attaching the connector circuit board in a notch in the back surface of the circuit board.

31. The method of claim 30, further comprising forming the notch prior to attaching the memory chips over the top surface.

32. The method of claim 29, further comprising electrically coupling the memory chips with contacts on the connector circuit board.

33. The method of claim 32, wherein electrically coupling comprises forming a solder joint.

34. The method of claim 32, wherein electrically coupling comprises forming a wire bond.

* * * * *